(12) United States Patent
Schott et al.

(10) Patent No.: US 7,038,448 B2
(45) Date of Patent: May 2, 2006

(54) MAGNETIC FIELD SENSOR

(75) Inventors: Christian Schott, Morges (CH);
Radivoje Popovic, St-Sulpice (CH);
Robert Racz, Zug (CH)

(73) Assignee: Sentron AG, Zug (CH)

( * ) Notice: Subject to any disclaimer, the term of this patent is extended or adjusted under 35 U.S.C. 154(b) by 0 days.

(21) Appl. No.: 10/478,573

(22) PCT Filed: May 21, 2002

(86) PCT No.: PCT/EP02/05559

§ 371 (c)(1),
(2), (4) Date: Jun. 3, 2004

(87) PCT Pub. No.: WO02/097463

PCT Pub. Date: Dec. 5, 2002

(65) Prior Publication Data

US 2004/0232913 A1    Nov. 25, 2004

(30) Foreign Application Priority Data

May 25, 2001 (EP) .................................. 01810518

(51) Int. Cl.
*G01R 33/07* (2006.01)
(52) U.S. Cl. .................... 324/251; 324/253; 73/514.31
(58) Field of Classification Search ............... None
See application file for complete search history.

(56) References Cited

U.S. PATENT DOCUMENTS

| 4,692,703 A | 9/1987 | Extance et al. |
| 4,963,827 A | 10/1990 | Popovic et al. |
| 5,199,178 A | 4/1993 | Tong et al. |
| 6,404,192 B1 | 6/2002 | Chiesi et al. |
| 6,545,462 B1 | 4/2003 | Schott et al. |

FOREIGN PATENT DOCUMENTS

| DE | 4102928 | 8/1991 |
| EP | 893699 A1 | 7/1998 |
| FR | 2802650 | 6/2001 |
| GB | 2340251 A | 7/1999 |
| WO | PCT/FR00/03521 A1 | 12/2000 |

OTHER PUBLICATIONS

L. Chiesi et al., CMOS Planar 2D Micro-Fluxgate Sensor, EPFL., Swiss Federal Institute of Technology, Institute of Microsystems (IMS), CH 1015 Lausanne, Switerland, Received Jun. 7, 1999, Received in Revised Form Nov. 2, 1999, Accepted Nov. 10, 1999.

*Primary Examiner*—Bot Ledynh
(74) *Attorney, Agent, or Firm*—McCormick, Paulding & Huber LLP

(57) ABSTRACT

A magnetic field sensor for measuring at least two components of a magnetic field comprises a ferromagnetic core mounted on a semiconductor chip, an exciter coil to which a current can be applied and two read-out sensors. The ferromagnetic core is ring-shaped. The exciter coil is preferably formed from conductor tracks of the semiconductor chip and from bonding wires.

12 Claims, 5 Drawing Sheets

MAGNETIC FIELD SENSOR

CROSS REFERENCE TO RELATED APPLICATION

Figure 1:
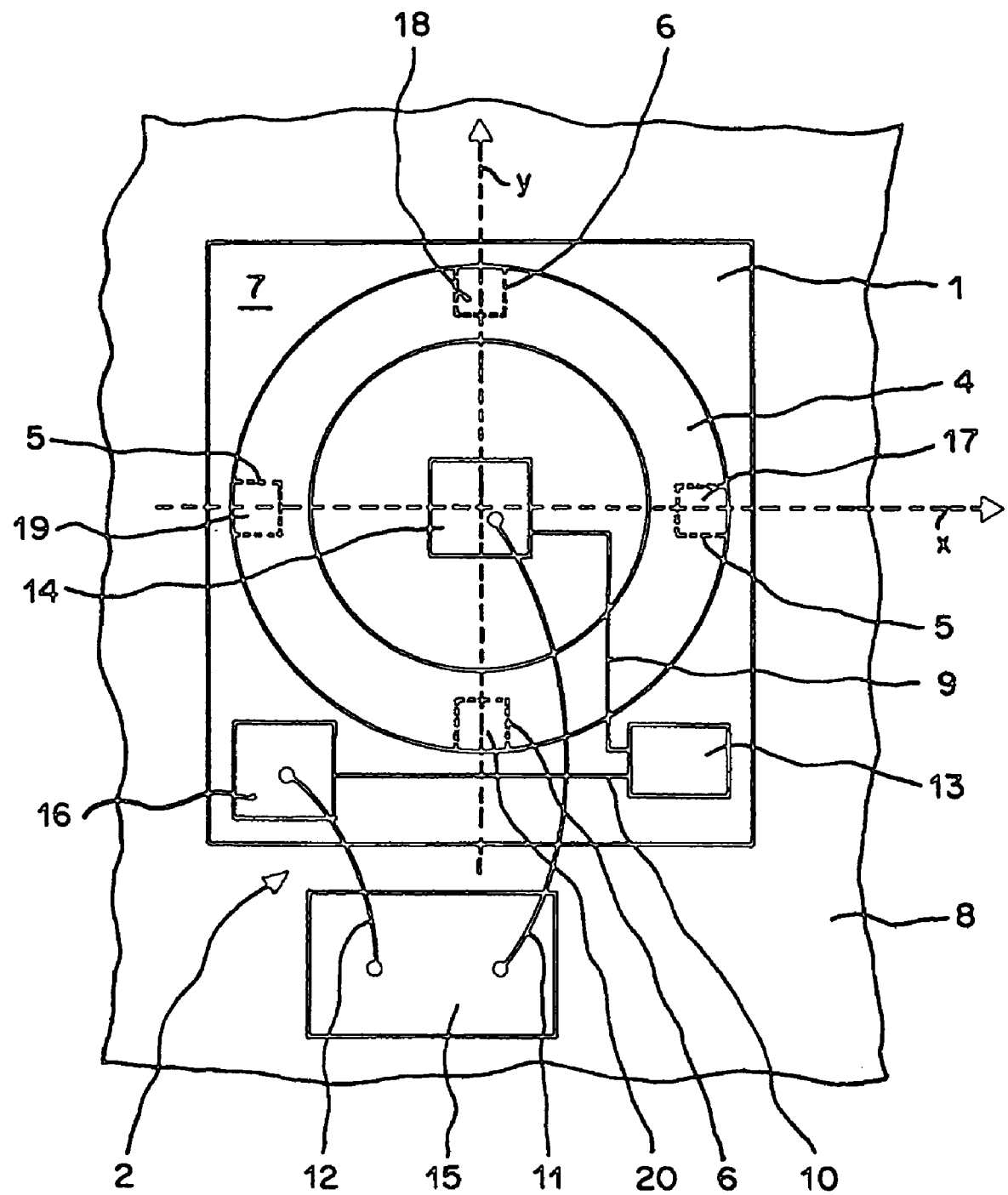

The present application is related to and claims priority of the following co-pending applications, namely, PCT application number PCT/EP02/05559 of Sentron AG entitled Magnetic Field Sensor, filed on May 21, 2002; and EP Application No. 01810518.9, filed May 25, 2001. The above-identified applications are incorporated herein by reference in their entirety.

FIELD OF THE INVENTION

The invention concerns a magnetic field sensor.

BACKGROUND OF THE INVENTION

Such magnetic field sensors are suited for the measurement of magnetic fields the strength of which are only a few nT to mT for example as a compass for measuring the direction of the earth's magnetic field.

A magnetic field sensor of the type named in the preamble of claim 1 is known from EP 1 052 519 A1 as well as from the article "CMOS planar 2D micro-fluxgate sensor" by the authors L. Chiesi, P. Kejik, B. Janossy and R. S. Popovic, which was published in the magazine Sensors and Actuators 82 (2000) 174–180. Such a magnetic field sensor contains a ferromagnetic core and an excitation coil through which alternating current flows in order to alternately magnetically saturate and demagnetise the core. An important disadvantage of this sensor exists in that an adequate sensitivity has to be taken at the expense of a relatively large ferromagnetic core. This stands in the way of a further miniaturisation and makes the sensor relatively expensive. A further problem exists in that the ferromagnetic core can be unintentionally magnetised by an outer magnetic field that is much larger than the actual field to be measured. The current flowing in the coil is then no longer able to freely align the individual magnetic domains, which leads to a measuring error.

A device for measuring one single component of a magnetic field is known from EP 359 922 A1 with which a ring-shaped ferromagnetic core serves to chop the magnetic field the direction of which is fixed. The ferromagnetic core however does not serve as a flux concentrator.

SUMMARY OF THE INVENTION

The object of the invention is to develop a concept for magnetic field sensors, which enables a further miniaturisation.

The invention assumes the principle of a fluxgate sensor as is known, for example, from the above-mentioned article. Fluxgate sensors have an exciter coil, a ferromagnetic core and a read-out coil. They are suitable for the measurement of weak magnetic fields as the magnetic field to be measured is chopped with the aid of the exciter coil and the ferromagnetic core, ie, is periodically switched on and off at the location of the read-out coil. The output signal of the read-out coil can then be evaluated synchronously to the chopping with the lock-in technique. The invention suggests that, for optimising the characteristics of a magnetic field sensor foreseen for the measurement of weak magnetic fields, all processes used in the semiconductor technology are included, ie, all processes from the start of the production of the semiconductor chip on a wafer over the post-processing where the ferromagnetic core is mounted, up to the backend where the semiconductor chip is mounted and encapsulated to the finished magnetic field sensor. This approach enables the use of a ring-shaped ferromagnetic core the advantage of which exists in that it can be magnetically saturated with a minimum of electric current and electrical power. The windings of the exciter coil then preferably consist of conductor tracks and bonding wires. In addition, the invention suggests that Hall elements be used instead of read-out coils because their size can be reduced as desired without loss in sensitivity. Such a magnetic field sensor can be greatly miniaturised.

In the following, embodiments of the invention are explained in more detail based on the drawing.

BRIEF DESCRIPTION OF THE DRAWING FIGURES

Figure 2A:
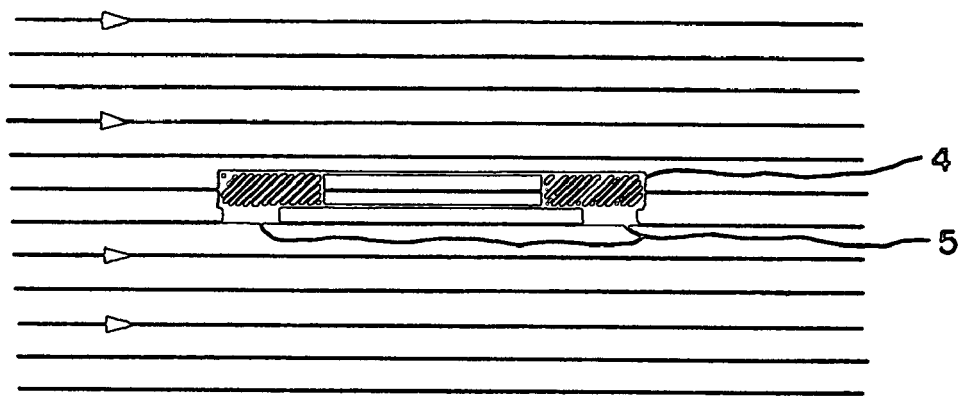
Figure 3:
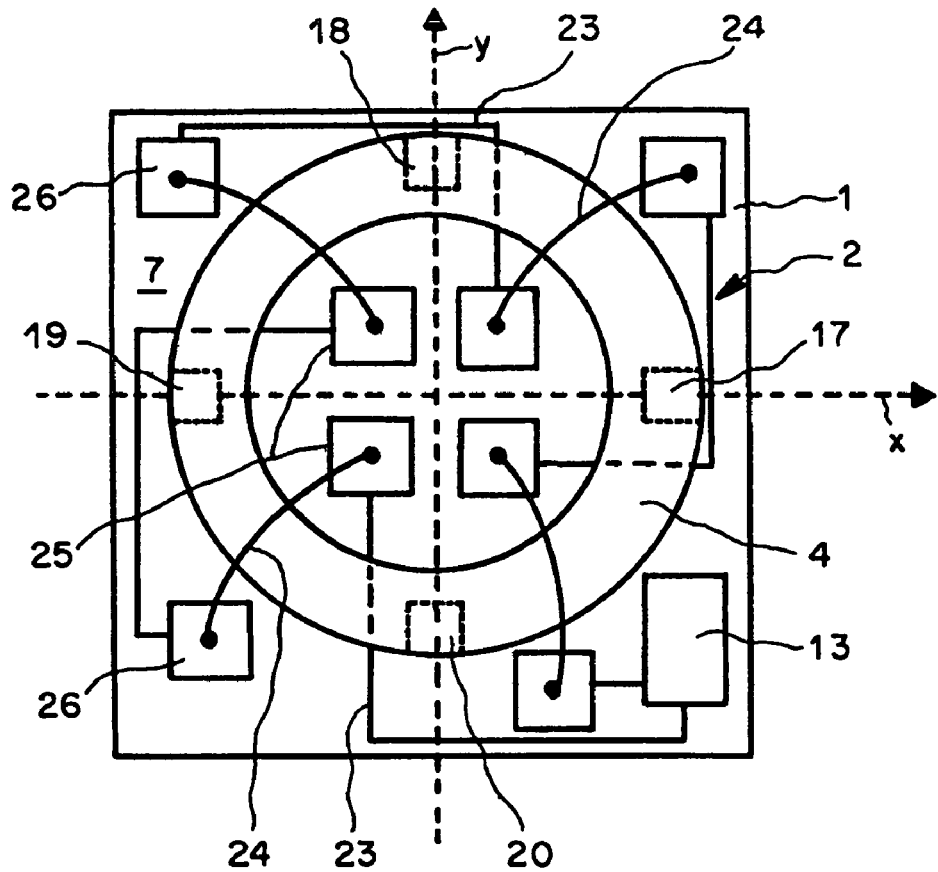
Figure 4:
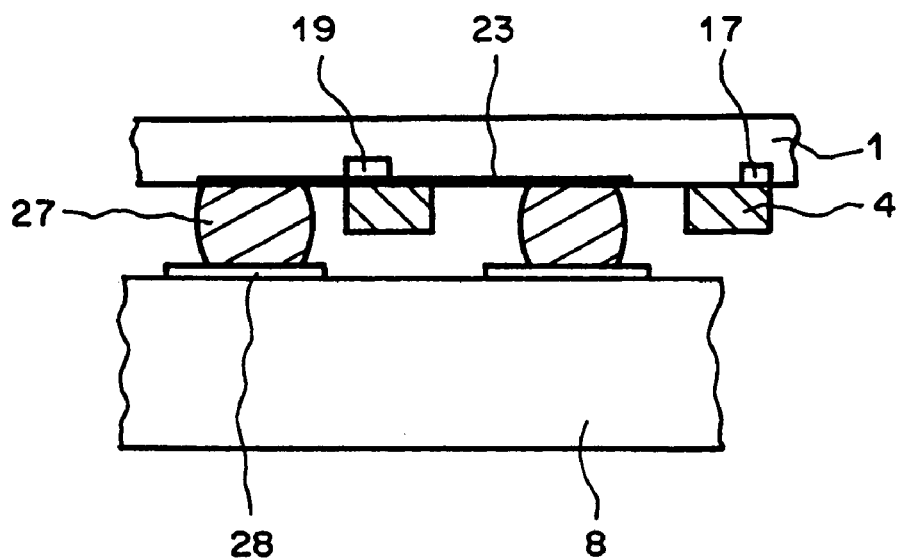
Figure 5:
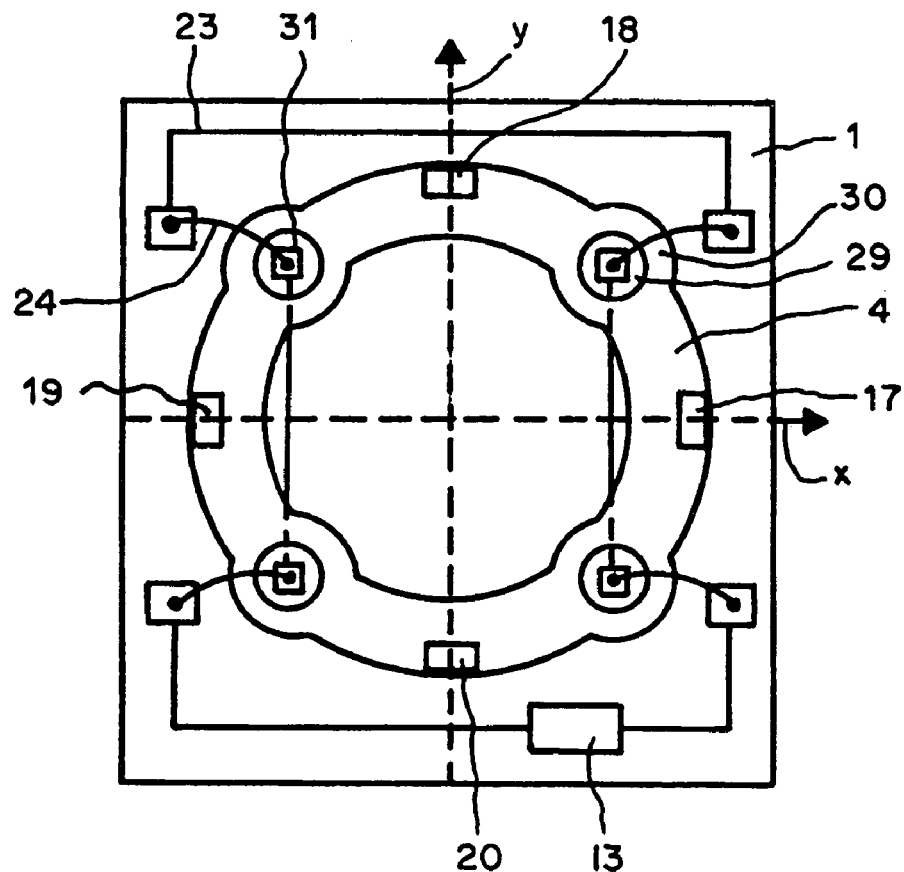
Figure 6:
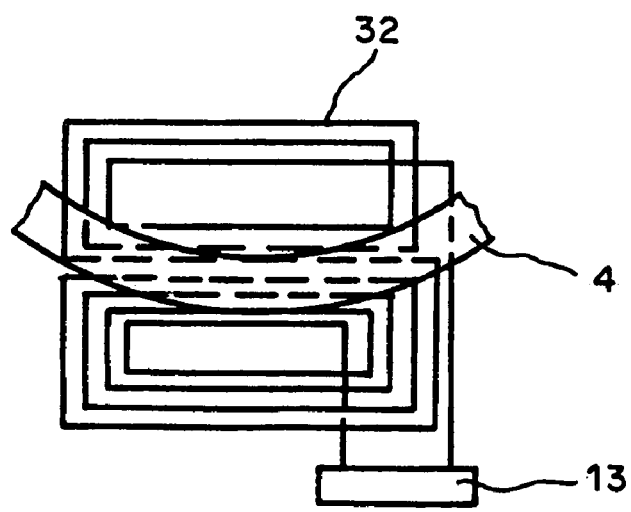
Figure 7:
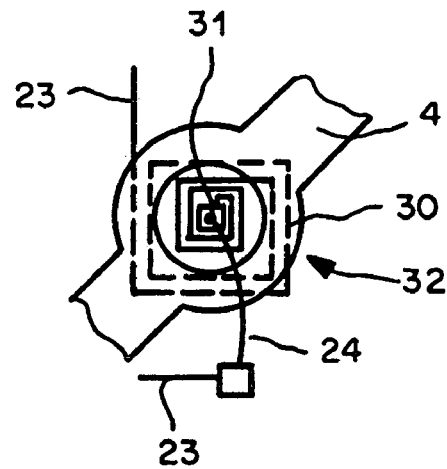
Figure 8:
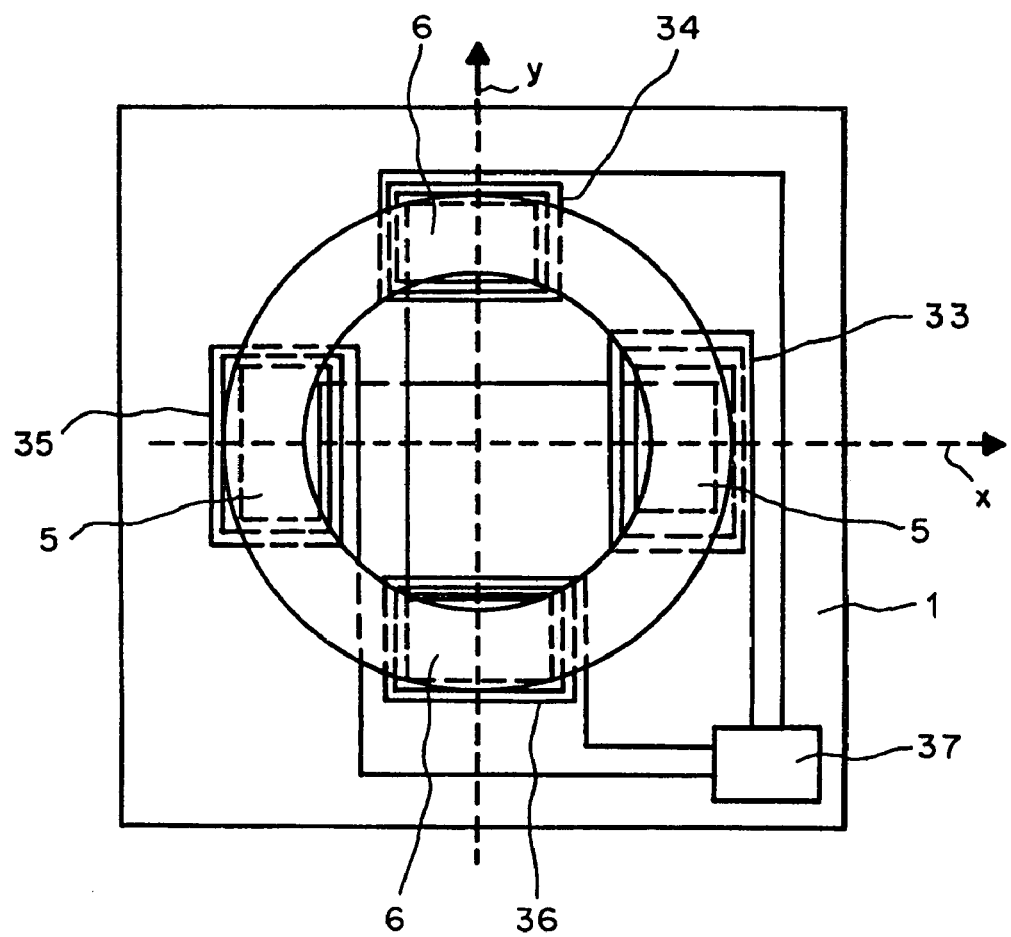

It is shown in:

FIG. 1 a magnetic field sensor with an exciter coil and a ferromagnetic core for chopping the measuring field, FIG. 2A, B field lines of a magnetic field, FIG. 3 a magnetic field sensor with an exciter coil with several windings, FIG. 4 a magnetic field sensor mounted as a flipchip, FIG. 5 a further magnetic field sensor, FIG. 6 a magnetic field sensor with an exciter coil formed as a flat coil, FIG. 7 details of a further exciter coil, and FIG. 8 a fluxgate sensor.

DETAILED DESCRIPTION OF THE PREFERRED EMBODIMENTS

FIG. 1 shows a plan view of a magnetic field sensor formed as a semiconductor chip 1 for the measurement of two components of a magnetic field. A cartesian x,y,z system of co-ordinates serves as reference system whereby the z direction runs vertically to the drawing plane. The magnetic field sensor comprises an exciter coil 2 with at least one winding to which current is applied, a ring-shaped ferromagnetic core 4, two read-out sensors 5, 6 and an electronic circuit 7. The read-out sensor 5 serves to detect the x component of the magnetic field, the read-out sensor 6 serves to detect the y component of the magnetic field. Preferably, each of the read-out sensors 5, 6 consists of two locally separated but electrically connected sensors. The magnetic field sensor is produced using a technology with which the electronic circuit 7, parts of the exciter coil 2 and the read-out sensors 5, 6 are first manufactured using a standard CMOS technology and then the ferromagnetic core 4 is applied in a so-called post-process. In doing so, a tape made of amorphous ferromagnetic material is glued onto the wafer with the semiconductor circuits and structured by means of photolithography and chemical etching. After sawing the wafer into the individual semiconductor chips, the at least one winding of the exciter coil 2 is completed on mounting the semiconductor chip onto a substrate 8 either by wire bonding or by means of the flipchip technology. The electronic circuit 7 serves to produce the current flowing through the exciter coil 2 and the evaluation of the signals delivered by the read-out sensors 5, 6.

With the embodiment shown in FIG. 1, the exciter coil 2 has one single winding which consists partially of a first conductor track 9 and a second conductor track 10 and partially of two bonding wires 11 and 12. The first conductor track 9 leads from a current source 13 arranged outside the ring-shaped ferromagnetic core 4 under the ferromagnetic core 4 to a first bond pad 14 arranged inside the ring-shaped ferromagnetic core 4. The first bonding wire 11 leads from the first bond pad 14 to a bond pad 15 on the substrate 8. The second bonding wire 12 leads from this bond pad 15 to a second bond pad 16 arranged on the semiconductor chip 1 outside the ring-shaped ferromagnetic core 4. The second conductor track 10 leads from the second bond pad 16 to the current source 13.

As material for the ferromagnetic core 4 serves, for example, the tape available under the designation VAC 6025Z made out of amorphous metal. This material has a coercive field strength of $H_c$=3 mA/cm. In order to magnetically saturate the ferromagnetic core 4, the current I flowing through the exciter coil 2 should produce a magnetic field $H_s$ that is around 20 times greater than the coercive field strength $H_c$. When the outer diameter D of the ring-shaped ferromagnetic core 4 amounts to D=300 μm and the number n of the windings of the exciter coil 2 amounts to n=1, then, according to the equation $$I=20*H_c*D*\pi/n \quad (1)$$

one gets I≅6 mA for the current. Furthermore, the duty cycle of the current I can be reduced to around 10% through which the average current requirement reduces to 0.6 mA. Because the ferromagnetic core 4 has no air gap, it can already be magnetically saturated by a small magnetic field and therefore by a low current I.

As read-out sensors 5 and 6 the magnetic field sensor has four so-called horizontal Hall elements 17, 18, 19 and 20 electrically coupled in pairs that are sensitive to a magnetic field that runs vertically to the surface of the semiconductor chip 1, ie, in z direction. The Hall elements 17 and 19 are arranged on the x axis of the cartesian system of co-ordinates and form the first read-out sensor 5, the Hall elements 18 and 20 are arranged on the y axis of the cartesian system of co-ordinates and form the second read-out sensor 6. The Hall elements 17 to 20 are each arranged underneath the ferromagnetic core 4 and, in fact, close to the outer edge of the ferromagnetic core 4.

In operation, the magnetic field sensor works as follows: A preferably square-wave shaped alternating current from the current source 13 is applied to the exciter coil 2. In doing so, the alternating current saturates and demagnetises the ferromagnetic core 4 with the frequency of the alternating current. In the phase where the ferromagnetic core 4 is magnetically saturated, it has no effect on the external magnetic field to be measured. The field lines of the magnetic field run parallel to the surface of the Hall elements 17 to 20: The Hall elements deliver no output signal. In the phase where the ferromagnetic core 4 is demagnetised, it has the effect of a magnetic flux concentrator on the magnetic field to be measured. Because the relative permeability $\mu_r$ of the ferromagnetic core 4 is very large in comparison to the relative permeability of its surroundings, the field lines of the magnetic field hit the surface of the ferromagnetic core 4 almost vertically and leave it at an almost vertical angle. The field concentration is greatest in the area of the edge of the ferromagnetic core 4 where the Hall elements 17 to 20 are located. The output signals from at least two of the four Hall elements 17 to 20 then differ from zero.

Figure 2B:
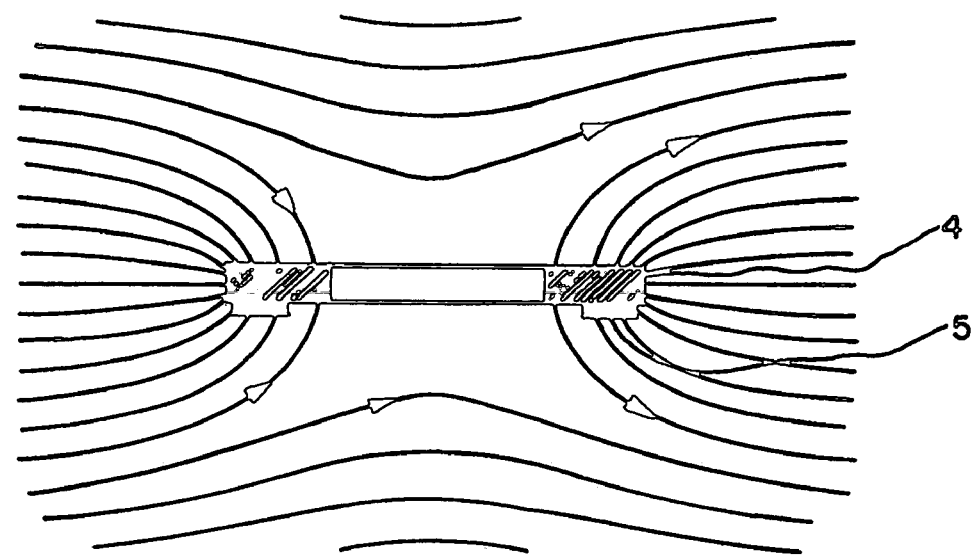

FIG. 2A shows the field lines 21 of the magnetic field when the ferromagnetic core 4 is saturated and when the magnetic field runs along the x direction and therefore parallel to the surface of the semiconductor chip 1. Only the ferromagnetic core 4 and two read-out sensors 5 are presented. The sectional plane of the figure runs vertically to the surface of the semiconductor chip 1 and parallel to the outer magnetic field. FIG. 2B shows the field lines 22 of the same magnetic field when the ferromagnetic core 4 is not saturated by the current flowing through the exciter coil. The field lines at the location of the two read-out sensors 5 point in a different z direction because the magnetic field enters the ferromagnetic core 4 at the location of one of the read-out sensors 5 (in FIG. 2B for example the left read-out sensor 5) and leave it again at the location of the other read-out sensor 5 (in FIG. 2B the right read-out sensor 5). The two read-out sensors 5 are correspondingly switched electrically.

The exciter coil 2 therefore serves to use the ferromagnetic core for chopping the magnetic field to be measured. The output signals of the Hall elements 17 to 20 can then be evaluated synchronously with the current flowing through the exciter coil 2 by means of the known lock-in technique.

In the following, further measures are now described the application of which leads to a higher sensitivity of the magnetic field sensor and/or to a lower current or energy consumption.

When the number of windings of the exciter coil 2 is increased to n, then, with the same energy consumption, either the current flowing through the exciter coil 2 can be reduced by the factor n or the diameter D of the ring-shaped ferromagnetic core 4 can be increased by the factor n. An increase in the diameter D has the effect of strengthening the flux concentration but also increases the space requirement and therefore the dimensions of the semiconductor chip 1. With regard to the aim of the greatest possible miniaturisation of the magnetic field sensor, optimum relationships are then achieved when the diameter D of the ferromagnetic core 4 is adapted to the dimensions of the semiconductor chip 1, which result from the space requirement for the electronic circuit 7, and the number n of windings 3 is adapted to the size of the ferromagnetic core 4.

FIG. 3 shows a plan view of a magnetic field sensor the exciter coil 2 of which has four windings connected in series. Each of the windings consists of a conductor track 23 and a bonding wire 24, whereby each bonding wire 24 leads from a bond pad 25 within the ferromagnetic core 4 to a bond pad 26 outside the ferromagnetic core 4. With this example, all bond pads are located on the semiconductor chip 1.

FIG. 4 shows a cross-section of a magnetic field sensor mounted as a flipchip with which the windings of the exciter coil are realised by means of conductor tracks 23 on the semiconductor chip 1, so-called bumps 27 and printed conductors 28 on the substrate 8.

With the magnetic field sensors described, the z components of the magnetic field can also be measured. Here, as opposed to a magnetic field running parallel to the surface of the semiconductor chip 1, the field lines of the magnetic field point in the same direction at all read-out sensors 5, 6 or Hall elements 17 to 20. The Hall elements 17 to 20 then have to be connected corresponding to this condition. For measurement of the components of the magnetic field running horizontally to the surface of the semiconductor chip 1, ie, the x and y components, the difference in the output voltage of the two Hall elements 17 and 19 or the two Hall elements 18 and 20 has to be determined while for measurement of the z components running vertically to the surface of the semiconductor chip 1 the sum of the output voltages of the Hall elements 17 to 20 has to be determined.

As long as the thickness of the ferromagnetic core 4, ie, its dimension in x direction, is comparatively small in comparison with its width, the ferromagnetic core 4 does not work as a flux concentrator for the z component of the magnetic field. When however the thickness corresponds to its width, then the ferromagnetic core 4 also works as a flux concentrator for the z component of the magnetic field. The magnetic field can then also be chopped for measurement of the z component by means of the current flowing through the exciter coil which considerably increases the sensitivity of the magnetic field sensor for the z component. The thickness of the ferromagnetic core 4 then preferably amounts to at least 0.5 times its width.

The current flowing through the exciter coil 2 can also be used to supply the Hall elements 17 to 20 as the ohmic resistance of the exciter coil 2 is low.

A further measure for increasing the efficiency of the magnetic field sensor consists in designing the ferromagnetic core 4 in such a way that the ferromagnetic core 4 can be magnetically saturated locally without the entire ferromagnetic core 4 being magnetically saturated. The magnetic field is then still sufficiently chopped in the area of the read-out sensors 5, 6, i.e., the Hall elements 17 to 20. FIG. 5 shows a plan view of a magnetic field sensor modified in this way. The ring-shaped ferromagnetic core 4 with the diameter D contains four holes 29 so that four small rings 30 are created each of which is arranged between two of the Hall elements 17 to 20. As an example, the large ring has a diameter of D=1.5 mm and the small rings 30 a diameter of d=150 μm. A bondpad 31 is located within each of the small rings 30. Such a small ring 30 presents a closed magnetic circuit. Again, the exciter coil consists of conductor tracks 23 and bonding wires 24 that are laid out and wired so that the current flowing through the exciter coil saturates the small rings 30. The current flowing through the exciter coil produces a magnetic field in each of the small rings 30 which magnetically saturates the small ring 30. Independently of the diameter D of the large ring, when using the metal tape VAC 6025Z a current I≅3 mA calculated in accordance with equation (1) is sufficient to magnetically saturate the small rings 30. When the small rings 30 are saturated, then the large ring loses its function as flux concentrator: The external magnetic field is chopped.

FIG. 6 shows a plan view of a section of a magnetic field sensor with which the exciter coil is designed in the form of a flat coil 32. The flat coil 32 occupies a part of the space underneath the ring-shaped ferromagnetic core 4. Because the magnetic field lines produced by the flat coil 32 can not be closed within the ferromagnetic core 4, interference fields are created. The dimensions of the flat coil 32 should therefore be small in comparison with the diameter D of the ferromagnetic core 4 and the flat coil 32 should be as far away as possible from the read-out sensors 5, 6 (or Hall elements 17–20). The flat coil 32 consists of two coil sections wound in opposite directions of which one coil section is essentially arranged within the ferromagnetic core 4, the other coil section is arranged outside the ferromagnetic core 4. The coil sections, as presented in FIG. 6, are wound so that the current flowing through the winding sections running close to the ferromagnetic core 4 flows in the same direction. Instead of one single flat coil, several flat coils can also be arranged along the ferromagnetic core 4.

With today's CMOS processes, several metal layers are customary. These metal layers can be used to realise the flat coils as long as they are not required for the electronic circuit 7.

The suggestions according to FIGS. 5 and 6 can be combined. FIG. 7 shows a section of the magnetic field sensor according to FIG. 5 comprising only one of the small rings 30. A flat coil 33 is arranged underneath the small ring 30 the windings of which circle spirally around the bond pad 31. With this solution, the exciter coil comprises the flat coil 33 and the windings formed from the conductor track 23 and the bonding wire 24.

When a great as possible miniaturisation of the magnetic field sensor is aimed for, then the form of the read-out sensors 5, 6 as Hall elements is the right choice. When on the other hand a highest possible sensitivity is aimed for so that extremely small magnetic fields can also be measured, then it is necessary on the one hand to make the diameter D of the ring-shaped ferromagnetic core 4 relatively large and, on the other hand, it is useful to choose flat coils as read-out sensors 5, 6. The sensitivity of the flat coils increases square to the available space and therefore square to the diameter D while the sensitivity of the Hall elements is independent of their size and therefore only increases linear to the diameter D. Therefore, with all the embodiments shown, the Hall elements can be replaced by flat coils. As an example, FIG. 8 shows a plan view of a magnetic field sensor with flat coils 34 to 37 which serve as read-out sensors 5. For reasons of clarity, the exciter coil is not drawn. The flat coils 34 to 37 are wound so that their windings encircle the magnetic field which, as shown in FIG. 2B, runs vertically to their surface. The flat coils 34 to 37 are preferably square-shaped or their shape is adapted to the curvature of the ring so that their windings encircle a largest possible section of the ferromagnetic core 4 and therefore a largest possible part of the magnetic flux. The read-out sensor 5 comprises the two flat coils 34 and 36, which are wound in opposite directions so that their signals are added. The read-out sensor 6 comprises the two flat coils 35 and 37. The flat coils 34 to 37 are connected to an evaluating circuit 38. Such a magnetic field sensor is also designated as a fluxgate sensor.

With the embodiments up to now, horizontal Hall elements have been used. However vertical Hall elements can also be used. These are however not to be arranged underneath the ferromagnetic ring but outside the ferromagnetic ring in the area of its outer edge. With the example in FIG. 3 the ideal position of the vertical Hall elements results from mirroring the position of the horizontal Hall elements 17–20 on the outer edge of the ferromagnetic core 4. Vertical Hall elements are namely sensitive to a magnetic field that runs parallel to their surface. The course of the field lines to be measured can be seen in FIG. 2B. The ideal position of the vertical Hall elements is therefore located next to the outer edge of the ferromagnetic core 4.

What is claimed is:

1. A magnetic field sensor for measuring at least two components of a magnetic field, comprising
a ferromagnetic core for concentrating the magnetic field, mounted on a surface of a semiconductor chip, having a generally flat shape extending substantially in a first plane and having an inner and an outer edge, the inner edge forming a boundary of an opening,
two read-out sensors for measuring a first and a second component of the magnetic field in said plane, the read-out sensors integrated in the semiconductor chip and located close to the outer edge of the ferromagnetic core,
an exciter coil having at least one winding, a part of the winding formed by a conductor track of the semiconductor chip and another part of the winding running outside the surface of the semiconductor chip, and a current source for applying an AC current to the exciter coil, the exciter coil and the ferromagnetic core serving for chopping the first and second component of the magnetic field.

2. The magnetic field sensor according to claim 1, wherein the ferromagnetic core has at least one hole located between the inner and the outer edge and wherein at least one winding of the exciter coil leads through this hole so that the current flowing through the exciter coil can magnetically saturate the ferromagnetic core in the area of the at least one hole without saturating the remaining areas of the ferromagnetic core.

3. The magnetic field sensor according to claim 1, wherein each of the read-out sensors comprises two horizontal Hall elements that are arranged diametrically to one another on opposite sides of the ferromagnetic core and underneath the ferromagnetic core.

4. The magnetic field sensor according to claim 2, wherein each of the read-out sensors comprises two horizontal Hall elements that are arranged diametrically to one another on opposite sides of the ferromagnetic core and underneath the ferromagnetic core.

5. The magnetic field sensor according to claim 1, wherein each of the read-out sensors comprises a vertical Hall element that is arranged outside the outer edge of the ferromagnetic core.

6. The magnetic field sensor according to claim 2, wherein each of the read-out sensors comprises a vertical Hall element that is arranged outside the outer edge of the ferromagnetic core.

7. The magnetic field sensor according to claim 1, for measuring three components of the magnetic field, wherein a thickness of the ferromagnetic core amounts to at least 0.5 times its width.

8. The magnetic field sensor according to claim 2, for measuring three components of the magnetic field, wherein a thickness of the ferromagnetic core amounts to at least 0.5 times its width.

9. The magnetic field sensor according to claim 3, for measuring three components of the magnetic field, wherein a thickness of the ferromagnetic core amounts to at least 0.5 times its width.

10. The magnetic field sensor according to claim 4, for measuring three components of the magnetic field, wherein a thickness of the ferromagnetic core amounts to at least 0.5 times its width.

11. The magnetic field sensor according to claim 5, for measuring three components of the magnetic field, wherein a thickness of the ferromagnetic core amounts to at least 0.5 times its width.

12. The magnetic field sensor according to claim 6, for measuring three components of the magnetic field, wherein a thickness of the ferromagnetic core amounts to at least 0.5 times its width.

* * * * *